United States Patent
Morita et al.

(10) Patent No.: US 6,501,154 B2
(45) Date of Patent: *Dec. 31, 2002

(54) SEMICONDUCTOR SUBSTRATE MADE OF A NITRIDE III-V COMPOUND SEMICONDUCTOR HAVING A WURTZITE-STRUCTURED CRYSTAL STRUCTURE

(75) Inventors: Etsuo Morita, Kanagawa (JP); Masao Ikeda, Kanagawa (JP); Hiroji Kawai, Kanagawa (JP)

(73) Assignee: Sony Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,743

(22) Filed: Jun. 2, 1998

(65) Prior Publication Data
US 2001/0048114 A1 Dec. 6, 2001

(30) Foreign Application Priority Data
Jun. 3, 1997 (JP) .............................. P09-145199

(51) Int. Cl.[7] ................................................ H01L 29/04
(52) U.S. Cl. ...................... 257/628; 257/103; 257/97; 257/627; 257/615
(58) Field of Search ............... 257/103, 97, 615, 257/627, 628

(56) References Cited

U.S. PATENT DOCUMENTS

| | | | |
|---|---|---|---|
| 4,567,393 A | 1/1986 | Asai et al. ............... 310/313 A |
| 5,006,908 A * | 4/1991 | Matsuoka et al. ........... 257/102 |
| 5,571,603 A | 11/1996 | Utumi et al. ................ 428/212 |
| 5,742,628 A * | 4/1998 | Fujii ............................ 372/45 |
| 5,821,568 A * | 10/1998 | Morita ......................... 257/97 |
| 5,864,171 A * | 1/1999 | Yamamoto ................... 257/628 |
| 5,874,747 A * | 2/1999 | Redwing et al. ............. 257/103 |
| 5,909,036 A * | 6/1999 | Tanaka ........................ 257/628 |
| 5,972,730 A * | 10/1999 | Saito et al. .................... 438/39 |
| 6,071,795 A * | 6/2000 | Cheung et al. ............. 438/458 |
| 6,072,197 A * | 6/2000 | Horino et al. ................ 257/103 |
| 6,083,812 A * | 7/2000 | Summerfelt ................. 117/950 |
| 6,163,557 A * | 12/2000 | Dunnrowicz et al. ......... 257/77 |
| 6,420,198 B1 * | 7/2002 | Kimura et al. ................ 438/22 |

FOREIGN PATENT DOCUMENTS

| | | |
|---|---|---|
| JP | 7249831 | 9/1995 |
| JP | 8264881 | 10/1996 |

* cited by examiner

*Primary Examiner*—Eddie Lee
*Assistant Examiner*—José R. Diaz
(74) *Attorney, Agent, or Firm*—Sonnenschein, Nath & Rosenthal

(57) ABSTRACT

There are provided a semiconductor substrate and a semiconductor laser using the semiconductor substrate which promises smooth and optically excellent cleaved surfaces and is suitable for fabricating semiconductor lasers using nitride III-V compound semiconductors. Using a semiconductor substrate, such as GaN substrate, having a major surface substantially normal to a {0001}-oriented face, e.g. {01-10}-oriented face or {11-20}-oriented face, or offset within ±5° from these faces, nitride III-V compound semiconductor layers are epitaxially grown on the substrate to form a laser structure. To make cavity edges, the GaN substrate is cleaved together with the overlying III-V compound semiconductor layers along high-cleavable {0001}-oriented faces.

8 Claims, 3 Drawing Sheets

SEMICONDUCTOR SUBSTRATE MADE OF A NITRIDE III-V COMPOUND SEMICONDUCTOR HAVING A WURTZITE-STRUCTURED CRYSTAL STRUCTURE

BACKGROUND OF THE INVENTION

1. Field of the Invention

This invention relates to a semiconductor substrate and a semiconductor device especially suitable for use in semiconductor lasers using nitride III-V compound semiconductors, such gallium nitride (GaN).

2. Description of the Related Art

Active researches. have been made in recently years on semiconductor lasers using nitride III-V compound semiconductors having wurtzite-structured crystal structures, represented by GaN as semiconductor lasers.

When a semiconductor laser using nitride III-V compound semiconductors is fabricated, GaN, AlGaN, GaInN, and so on, are epitaxially grown in multiple layers on a sapphire substrate or a silicon carbonate (SiC) substrate to make a structure sandwiching an active layer between an n-type cladding layer and a p-type cladding layer. Good-quality epitaxial layers can be made when {0001}-oriented surfaces of these layers results in being parallel to the substrate when they are grown by the epitaxial growth. There is a report on continuous oscillation at a room temperature with a semiconductor laser made by epitaxial growth (IEEE Lasers and Electro-Optics Society 1996 Annual Meeting, Postdeadline Papers, Nov. 1996).

When a semiconductor laser is fabricated, it is necessary to make an edge used as a reflective surface of the cavity. The cavity edge is usually made by cleaving a structure having epitaxially grown layers on a substrate along a face normal to the layer surfaces or interfaces, utilizing the cleavability of crystals. In this case, the cleavability of the substrate much thicker than epitaxial layers is especially important. In case of semiconductor lasers using III-V compound semiconductors such as AlGaAs, AlGaInP, and so forth, and semiconductor lasers using II-VI compound semiconductors such as ZnSSe, CdZnSe, and so forth, by utilizing a high cleavability of a GaAs substrate used as the substrate and by cleaving epitaxial layers, also having a high cleavability, together with the GaAs substrate, flat cavity edges normal to the substrate surface or surfaces of the epitaxial layers are formed.

There are other methods used for making cavity edges normal to substrate surfaces, such as reactive ion etching (RIE) or chemical wet etching. However, since nitride III-V compound semiconductor crystals exhibit a high chemical stability, it is very difficult to actually make cavity edges by using chemical wet etching. If RIE is used, damages to cavity edges or unacceptable flatness of cavity edges arise as problems.

Therefore, in semiconductor lasers using nitride III-V compound semiconductors, it has been tried to make cavity edges by cleavage. Also for laser semiconductor lasers using low-cleavable substrates, such as sapphire substrates, on which laser oscillation has been reported, epitaxial layers grown on a sapphire substrate were cleaved simultaneously by cleaving the sapphire substrate. Usually, such sapphire substrates have {0001}-oriented major surfaces, and cavity edges are {11-20}-oriented surfaces of epitaxial layers forming laser structures. A reason why sapphire substrates having {0001}-oriented major surfaces are used lies in that {11-20}-oriented surfaces of crystals having wurtzite-structured crystal structures have atomic arrangements (bonding) similar to those of {110}-oriented surfaces which are cleavage surfaces of crystals having zinc blende structures similar to wurtzite-structured crystal structures, and have a cleavability to a certain extent.

However, cavity edges actually made by the method were found to exhibit uneven faces with longitudinal ridge-shaped steps approximately normal to the substrate surfaces. They were probably caused by a low cleavability of {11-20}-oriented surfaces, stresses in epitaxial layers (due to a difference in lattice constant with substrates), and crystallographic irregularities in epitaxial layers (presence of internal crystallographic defects or mosaic crystals). Cavity edges having such unevenness are bad in reflective efficiency and parallelism, and fail to exhibit acceptable characteristics as cavities. These are factors that not only degrade characteristics and efficiencies of semiconductor lasers, but also cause deterioration of devices and degradation of their reliability.

There is another trial of growing a thick GaN crystal layer on a sapphire or other substrate and using the GaN crystal as a substrate to epitaxially grow nitride compound III-V semiconductors thereon. This method also uses {0001}-oriented surface to epitaxially grow nitride III-V compound semiconductors layers, and result in using {11-20}-oriented surfaces as cleavage surfaces like the method explained above. Here again, therefore, it is difficult to obtain good-quality cavity edges.

As discussed above, it has been difficult to obtain good-quality cavity edges by cleavage in semiconductor lasers using nitride III-V compound semiconductors.

SUMMARY OF THE INVENTION

It is therefore an object of the invention to provide a semiconductor substrate making it easy to obtain flat and optically excellent cleavage surfaces and hence suitable for use in fabrication of semiconductor lasers using nitride III-V compound semiconductors, and to provide a semiconductor device using the semiconductor substrate, having a high efficiency, long life and high reliability, and suitable for use in semiconductor lasers.

According to the invention, there is provided a semiconductor substrate made of a nitride III-V compound semiconductor having a wurtzite-structured crystal structure, and having a major surface normal to the {0001}-oriented face.

According to the invention, there is also provided a semiconductor device comprising: a semiconductor substrate made of a nitride III-V compound semiconductor having a wurtzite-structured crystal structure, and having a major surface normal to the {0001}-oriented face; and nitride III-V compound semiconductor layers on said semiconductor substrate.

In the present invention, the major surface of the semiconductor substrate may be any of faces normal to the {0001}-oriented face (called C-face). Specifically, a {01-10}-oriented face (called M-face), {11-20}-oriented face (called A-face), or other faces slightly offset from these faces, may be used. When a face offset from the {01-10}-oriented face or the {11-20}-oriented face is used as the major surface of the semiconductor substrate, the major surface, preferably, is substantially normal to the {0001}-oriented face with an offset angle, if any, within ±5°.

Throughout the present application, {01$\bar{1}$0} is expressed as {01-10}, and {11$\bar{2}$0} as {11-20}, to describe surface orientations.

In the present invention, nitride III-V compound semiconductor layers contain at least one of group III elements selected from the group consisting of Ga, Al, In and B, and at least N, and may additionally contain group V elements involving As or P. Specific examples of the nitride III-V compound semiconductor layers are a GaN, layer, AlGaN layer, GaInN layer, AlGaInN layer, and so forth.

The semiconductor substrate according to the invention can-be manufactured easily by the method explained below, for example. That is, first grown is a bulk crystal of a nitride III-V compound semiconductor having a wurtzite-structured crystal structure. The nitride III-V compound semiconductor bulk crystal can be grown, for example, by growth from liquid Ga at a high temperature of 1400° C. through 1600° C. in a high-pressurized nitrogen atmosphere of 10 through 20 kbar (J. Crystal Growth 166(1996) 583) or by a flux method or sublimation configured to promote growth by heating metal Ga and sodium azide confined in a stainless tube to 600 through 700° C. Then, the nitride III-V compound semiconductor bulk crystal is cut along a face substantially normal to its {0001}-oriented face, namely, {01-10}-oriented face (M-face) or {11-20}-oriented face (A-face), for example, and the surface of the cut-out crystal is polished to smooth the surface. As a result, the semiconductor substrate according to the invention can be obtained.

Alternatively, the semiconductor substrate according to the invention can be manufactured by another method explained below. That is, epitaxially grown is a bulk crystal of a nitride III-V compound semiconductor with a sufficient thickness, for example, as thick as 100 μm or more, on a crystal substrate such as sapphire substrate or SiC substrate, by sublimation or hydride vapor phase epitaxy (HVPE), for example, so that a surface substantially normal to its {0001}-oriented face, namely, the {01-10}-oriented surface or the {11-20}-oriented surface, for example, be parallel to the substrate. Then, the surface of the epitaxial layer is polished to smooth the surface. After that, by removing the substrate used for the growth from the bottom mechanically or by chemical wet etching, the semiconductor substrate according to the invention can be made. Prior to removal of the sapphire substrate or SiC substrate, one or more nitride III-V compound semiconductor layers may be epitaxially grown on the nitride III-V compound semiconductor bulk crystal epitaxially grown on the substrate, and the substrate may be removed thereafter.

According to the invention having the above-summarized construction, the semiconductor substrate made of a nitride III-V compound semiconductor having a wurtzite-structured crystal structure and having a major surface substantially normal to its {0001}-oriented face can be readily cleaved along the {0001}-oriented face because the {0001}-oriented face is the face having the highest cleavability in a crystal having the layered-structured wurtzite-structured crystal structure, namely, the high-cleavable face. Therefore, when nitride III-V compound semiconductor layers are epitaxially grown on the semiconductor substrate to for a semiconductor laser, cavity edges can be formed easily by cleaving these nitride III-V compound semiconductor layers together with the semiconductor substrate along {0001}-oriented faces.

Moreover, since the semiconductor substrate is made of a nitride III-V compound semiconductors, both the semiconductor substrate and the nitride III-V compound semiconductor layers thereon have wurtzite-structured crystal structures, and coincide, or are very near, in lattice constant. Therefore, the nitride III-V compound semiconductor layers have a good quality, remarkably diminished in stress and inner crystallographic defects. Additionally, since the semiconductor substrates and the nitride III-V compound semiconductor layers are substantially equal in lattice constant, the nitride III-V compound semiconductor layers can be grown epitaxially, without the need for a buffer layer of GaN or AlN grown under a low temperature prior to the epitaxial growth of the nitride III-V compound semiconductor layers, which is required when using a sapphire substrate, for example. Therefore, the present invention can prevent a mosaic structure from being produced in the nitride III-V compound semiconductor layers, which must be taken into account when using a sapphire substrate, for example. Thus, the nitride III-V compound semiconductor layers have an excellent quality also in this respect.

For these reasons, cleavage surfaces obtained by cleaving the semiconductor substrate together with the nitride III-V compound semiconductor layers thereon exhibit an optically excellent quality with substantially no unevenness, and are suitable for use as cavity edges of semiconductor lasers.

The above, and other, objects, features and advantage of the present invention will become readily apparent from the following detailed description thereof which is to be read in connection with the accompanying drawings.

DESCRIPTION OF THE PREFERRED EMBODIMENTS

Figure 1:
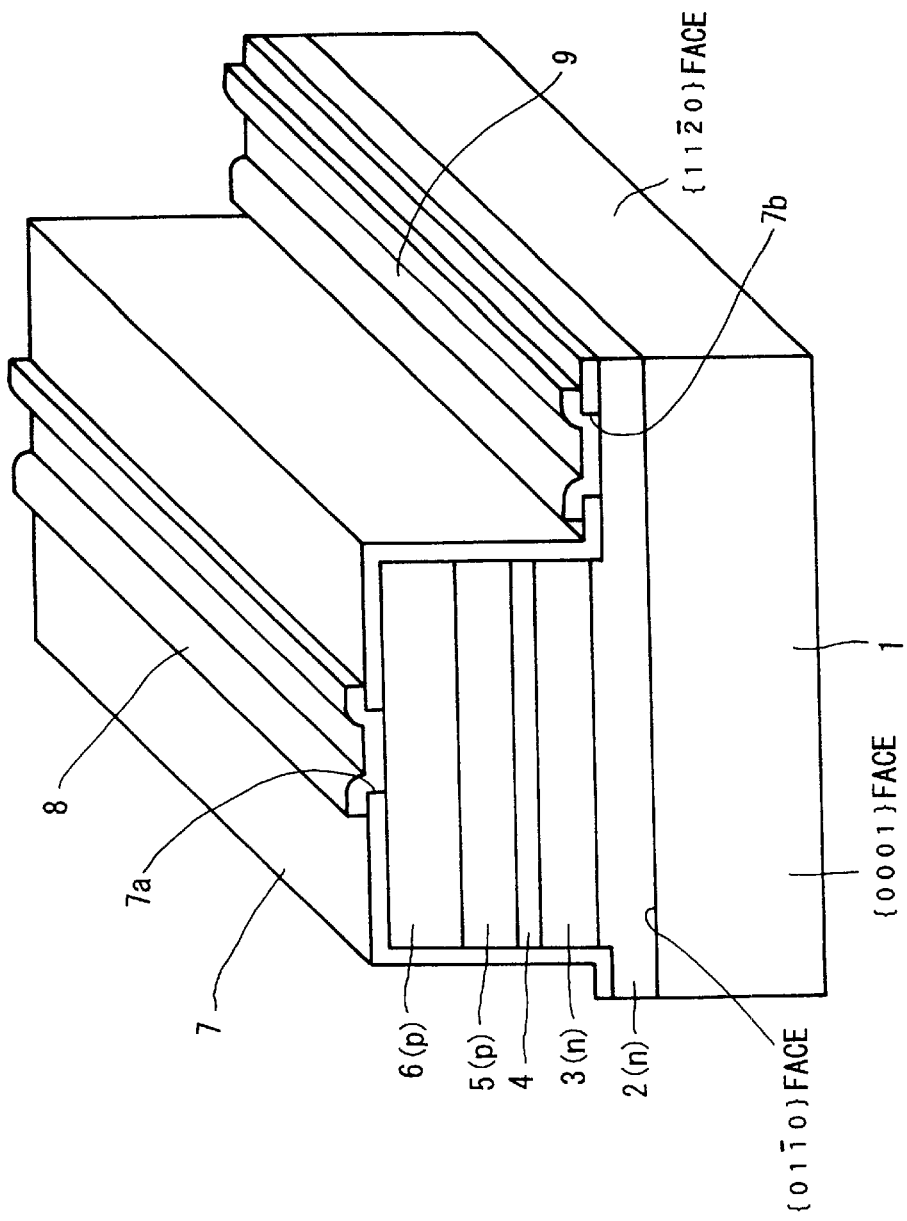
FIG. 1 is a perspective view of a GaN semiconductor laser according to a first embodiment of the invention.

Embodiments of the invention are explained below with reference to the drawings. In all figures illustrating embodiments, the same or equivalent elements are labeled with common reference numerals.

FIG. 1 shows the GaN semiconductor laser according to the first embodiment of the invention. As shown in FIG. 1, in the GaN semiconductor laser according to the first embodiment, epitaxially grown on an undoped GaN substrate 1 having a {01-10}-oriented surface (M-face) as its major surface are, in sequence, an n-type GaN contact layer 2, n-type $Al_xGa_{1-x}N$ cladding layer 3, active layer 4 made of n-type $Ga_{1-y}In_yN$ which may be doped in a low impurity concentration, or undoped, p-type $Al_zGa_{1-z}N$ cladding layer 5 and p-type GaN contact layer 6. These nitride III-V compound semiconductor layers have {01-10} surface orientation. The mole fraction x of Al in the n-type $Al_xGa_{1-x}N$ cladding layer 3 is in the range of $0 \leq x \leq 1$, the mole fraction z of Al in the p-type $Al_zGa_{1-z}N$ cladding layer 5 is in the range of $0 \leq z \leq 1$, and the mole fraction y of In in $Ga_{1-y}In_yN$ forming the active layer 4 is in the range of $0 \leq y \leq 1$. The n-type GaN contact layer 2 and the n-type $Al_xGa_{1-x}N$ cladding layer 3 are doped with Si, for example, as the n-type impurity. The p-type $Al_zGa_{1-z}N$ cladding layer 5 and the p-type GaN contact layer 6 are doped with Mg, for example, as the p-type impurity. In an example, the n-type GaN contact layer 2 is 3 μm thick, n-type $Al_xGa_{1-x}N$ cladding layer 3 is 0.5 μm thick, active layer 4 is 0.05 μm thick, p-type $Al_zGa_{1-z}N$ cladding layer 5 is 0.5 μm thick, and p-type GaN contact layer 6 is 1 μm thick.

An upper-lying part of the n-type GaN contact layer, n-type $Al_xGa_{1-x}N$ cladding layer 3, active layer 4, p-type $Al_zGa_{1-z}N$ cladding layer 5 and p-type GaN contact layer 6 are shaped into a stripe extending in the <0001>direction. An insulation film 7 made of $SiO_2$, for example, is provided to cover surfaces of the stripe portion and the other portions. The insulation film 7 has formed stripe-shaped apertures 7a and 7b in locations above the p-type GaN contact layer 6 and the n-type GaN contact layer 2 to extend in <0001>directions. These apertures 7a and 7b are 5 μm wide, for example. A p-side electrode 8 is brought into contact with the p-type contact layer 6 through the aperture 7a, and an n-side electrode 9 is brought into contact with the n-type GaN contact layer 2 through the aperture 7b. The p-side electrode 8 may be a Ni/Au film, for example, and the n-side electrode 9 may be a Ti/Al/Au film, for example.

In the first embodiment, a pair of cavity edges and end surfaces of the GaN substrate 1 on the common face with the cavity edges are {0001}-oriented surfaces (C-faces), and opposite side surfaces of the cavity are {11-20}-oriented surfaces (A-faces).

Next explained is a method for manufacturing the GaN semiconductor laser having the construction according to the first embodiment.

First of all, the GaN substrate 1 having the {01-10}-oriented surface (M-face) as its major surface is heated to 1050° C., for example, in an atmosphere containing nitrogen ($N_2$) in an reactive tube of a metal organic chemical vapor deposition (MOCVD) apparatus to thermally clean its surface. Next formed sequentially on the GaN substrate 1 are the n-type GaN contact layer 2, n-type $Al_xGa_{1-x}N$ cladding layer 3, active layer made of $Ga_{1-y}In_yN$, p-type $Al_zGa_{1-z}N$ cladding layer 5, and p-type GaN contact layer 6 by epitaxial growth using MOCVD. During epitaxial growth of the n-type GaN contact layer 2, n-type $Al_xGa_{1-x}N$ cladding layer 3, p-type $Al_zGa_{1-z}N$ cladding layer 5 and p-type GaN contact layer 6, the temperature is set to about 1000° C., for example. During epitaxial growth of the $Ga_{1-y}In_yN$ active layer 4, the temperature is set lower, about 700 through 850° C., for example, to minimize decomposition of InN. These nitride III-V compound semiconductor layers epitaxially grow in the {01-10} surface orientation. In this case, since the nitride III-V compound semiconductor layers have the same crystallographic structure as that of the GaN substrate 1, and their lattice constants are equal, or very near, to that of the GaN substrate 1, there occurs substantially no stress, no cracks thereby, or no crystallographic defects caused by a difference in crystal structure or lattice constant, during epitaxial growth of the nitride III-V compound semiconductor layers. Therefore, good-quality nitride III-V compound semiconductor layers can be grown. Moreover, since the difference in lattice constant between the GaN substrate 1 and the nitride III-V compound semiconductor layers is very small, it is prevented that unintentional diffusion of impurities occurs in the nitride III-V compound semiconductor layers due to a distortion caused by a difference in lattice constant.

Next formed on the p-type GaN contact layer 6 is a stripe-shaped resist pattern (not shown) extending in the <0001>direction by lithography. Using the resist pattern as a mask, etching is performed to selectively remove the layers to the depth biting into the n-type GaN contact layer 2. As a result, the upper-lying part of the n-type GaN contact layer 2, n-type $Al_xGa_{1-x}N$ cladding layer 3, active layer 4, p-type $Al_zGa_{1-z}N$ cladding layer 5 and p-type GaN contact layer 6 are patterned into the form of a stripe extending in the <0001>direction.

After removing the resist pattern used as the etching mask, an insulation film 7 is formed on the entire surface by CVD or sputtering, for example. Then, the insulation film 7 is selectively removed by sputter-etching, for example, to make the apertures 7a and 7b.

After that, a Ni/Au film is stacked on the entire surface by vacuum evaporation or sputtering, for example, and it is patterned by etching to form the p-side electrode 8. Similarly, a Ti/Al/Au film is stacked on the entire surface by vacuum evaporation or sputtering, for example, and it is patterned by etching to form the n-side electrode 9.

Figure 2:
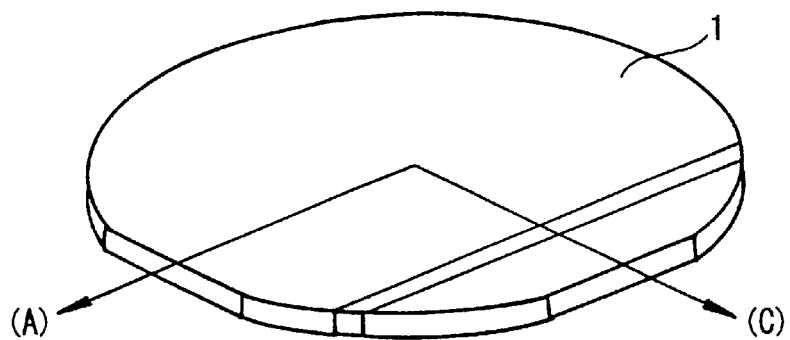
FIG. 2 is a perspective view for explaining a method for manufacturing the GaN semiconductor laser according to the first embodiment of the invention.
Figure 3:
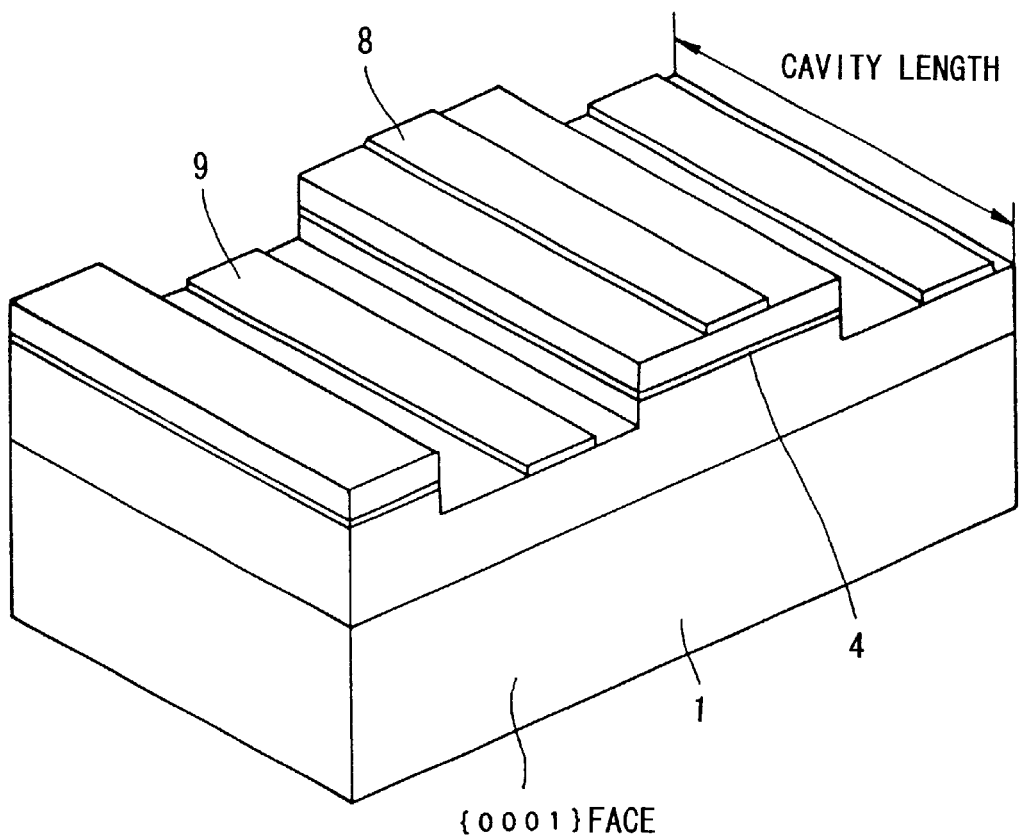
FIG. 3 is a perspective view for explaining a method for manufacturing the GaN semiconductor laser according to the first embodiment of the invention.

Next, as shown in FIG. 2, by cleaving the GaN substrate 1 into bars along its high-cleavable {0001}-oriented faces, the n-type GaN contact layer 2, n-type $Al_xGa_{1-x}N$ cladding layer 3, active layer 4, p-type $Al_zGa_{1-z}N$ cladding layer 5 and p-type GaN contact layer 6 epitaxially grown on the GaN substrate 1 are cleaved together along their {0001}-oriented faces. In FIG. 2, (A) and (C) denote directions normal to the A-face and C-face, respectively. As a result of cleavage, cavity edges which are {0001}-oriented can be obtained.

Practically, the cleavage may be done as follows. That is, marking lines, or grooves with wedge-, V- or U-shaped cross-sectional configurations not to be flat at bottoms, are formed on a selective or entire bottom surface of the GaN substrate to extend straight in <0001>directions in parallel in intervals corresponding to the cavity length. These marking lines or grooves may be formed by using a scriber, dicing tool, or the like. Then, while applying a tensile force to the GaN substrate 1 in directions parallel to its major surface and normal to the marking lines or grooves formed on the bottom surface of the GaN substrate 1, an external force is applied to bend the GaN substrate 1 arcuately, or a thermal stress or ultrasonic wave is applied, to cause stress concentration at the marking lines or deepest portions of the grooves. As a result, the GaN substrate 1 cleaves from the marking lines or grooves formed on the bottom surface along the high-cleavable {0001}-oriented faces (C-faces), and also the nitride III-V compound semiconductor layers on the GaN substrate 1 cleave altogether. At that time, since the crystallographic orientation of the nitride III-V compound semiconductor layers is the same as the crystallographic orientation of the GaN substrate 1, also the cleaved surfaces of the nitride III-V compound semiconductor layers are {0001}-oriented. The {0001}-oriented cleaved surfaces are smooth in the atomic level.

The cleaved bar-shaped GaN substrates 1 and the nitride III-V compound semiconductor layers thereon are ripped or cut into chips along directions normal to the cavity length, for example, to obtain laser chips. For practically chipping the bar-shaped semi-products, marking lines or grooves are here again made on the bottom surface of each bar-shaped GaN substrate 1 obtained by cleavage to extend straight in parallel with each other in directions along the {11-20}-oriented surfaces (A-face) in intervals corresponding to the chip width. After that, in substantially the same manner as explained above, the GaN substrate 1 and the nitride III-V compound semiconductor layers are cleaved altogether along {11-20}-oriented faces. The {11-20}-oriented face is less cleavable than the {0001}-oriented face, but it is still amply cleavable next to the {0001}-oriented face. Therefore, the bar-shaped substrates and the layers thereon can be cleaved easily. Since these {11-20}-oriented cleaved surfaces are not used as cavity edges? they need not have an optically high quality, and do not adversely affect the characteristics of the semiconductor lasers.

As explained above, according to the first embodiment, by using the GaN substrate 1 having the {01-10}-oriented major surface normal to its {0001}-oriented face and by epitaxially growing the nitride III-V compound semiconductor layers, these nitride III-V compound semiconductor layers have excellent qualities with substantially no crystallographic defects. Accordingly, when the nitride III-V compound semiconductors are cleaved together along their {0001}-oriented faces by cleaving the GaN substrate 1 along its {0001}-oriented faces to make cavity edges, the cavity edges exhibit very flat, polished surfaces with substantially no unevenness. therefore, the cavity edges are optically excellent, with a high reflectance and hence with a low reflection loss. It is also possible to increase the parallelism of the cavity edges. As a result, the threshold current density and the energy loss can be reduced remarkably, and a long-life, high-reliable GaN semiconductor laser can be realized.

Moreover, the GaN substrate 1 used here is the same kind of material as the nitride III-V compound semiconductor layers forming the laser structure, a GaN or AlN buffer layer required in a structure using a sapphire substrate need not be grown at a low temperature. Instead, the nitride III-V compound semiconductor layers can be epitaxially grown well directly on the GaN substrate. Therefore, the embodiment prevents that a mosaic structure appears, which has been reported to appear in nitride III-V compound semiconductor layers grown on a sapphire substrate or a SiC, and that longitudinal ridge-shaped steps appear on cleaved edges, which are probably caused by crystallographic irregularity.

Additionally, the GaN semiconductor laser can be manufactured more easily than conventional GaN semiconductor lasers because the GaN substrate 1 and the overlying nitride III-V compound semiconductor layers have a high cleavability and enable cavity edges to be formed easily by cleavage.

Next explained is a GaN semiconductor laser according to the second embodiment of the invention.

In the GaN semiconductor according to the second embodiment, the GaN substrate 1 has a {11-20}-oriented surface (A-face) major as its major surface, and stacked thereon sequentially are the n-type GaN contact layer 2, n-type $Al_xGa_{1-x}N$ cladding layer 3, active layer 4, p-type $Al_zGa_{1-z}N$ cladding layer 5 and p-type GaN contact layer 6. These nitride III-V compound. semiconductor layers have {11-20} surface orientation. In this case, opposite side surfaces of the cavity are {01-10}-oriented surfaces (M-face). The other aspects of the GaN semiconductor laser shown here are the same as those of the GaN semiconductor laser according to the first embodiment, and their explanation is omitted here.

To fabricate the GaN semiconductor laser according to the second embodiment, the same method as used for fabricating the GaN semiconductor laser according to the first embodiment is used. Therefore, explanation of the manufacturing process is omitted here.

The second embodiment also has the same advantages as those of the first embodiment.

Figure 4:
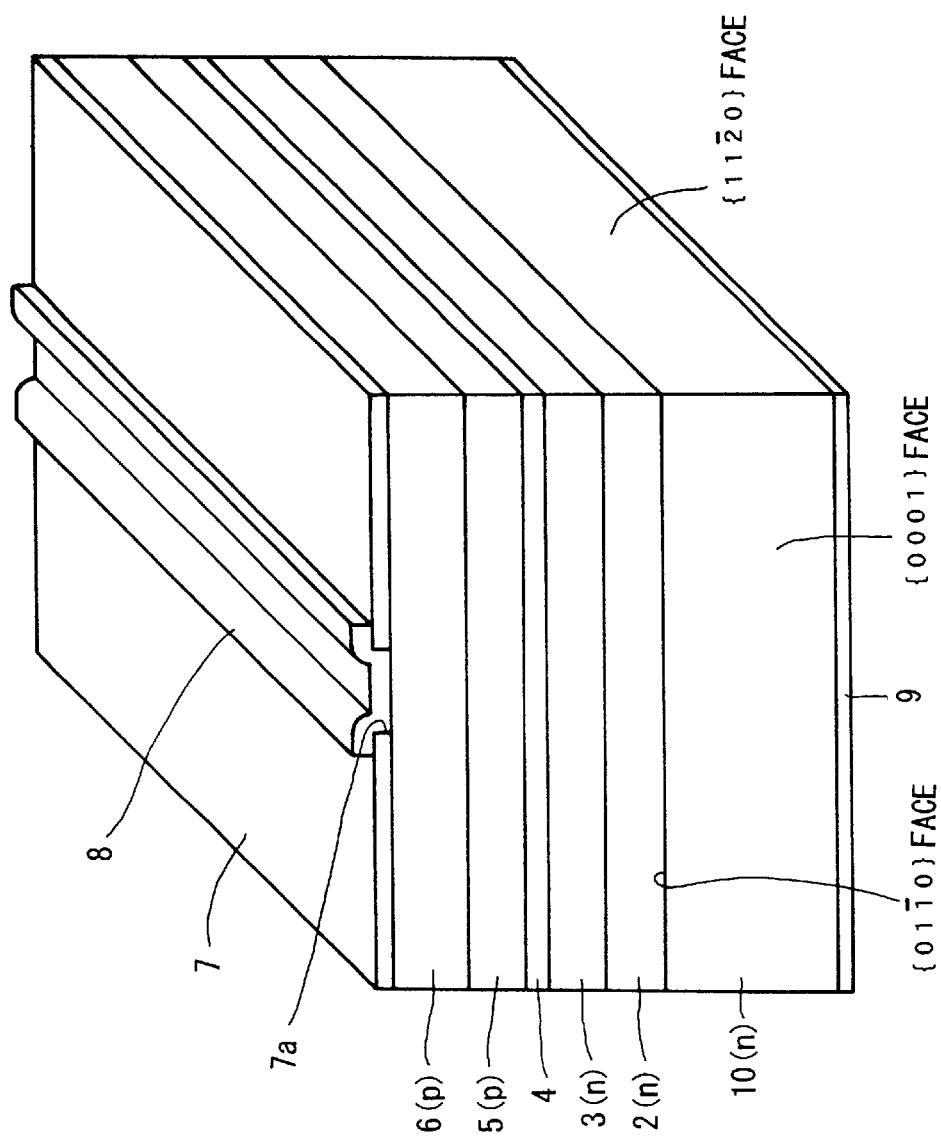
FIG. 4 is a perspective view of a GaN semiconductor laser according to a second embodiment of the invention.

FIG. 4 shows a GaN semiconductor laser according to the third embodiment of the invention. With reference to FIG. 4, the GaN semiconductor laser according to the third embodiment has formed, on a n-type GaN substrate 10 having a {01-10}-oriented surface (M-face) as its major surface, the n-type GaN contact layer 2, n-type $Al_xGa_{1-x}N$ cladding layer 3, n-type active layer 4 made of low impurity-concentrated or undoped $Ga_{1-y}In_yN$, for example, p-type $Al_zGa_{1-z}N$ cladding layer 5 and p-type GaN contact layer 6 which are stacked sequentially. These nitride III-V compound semiconductor layers have {01-10} surface orientation. The mole fraction x of Al in the n-type $Al_xGa_{1-x}N$ cladding layer 3 is $0 \leq x \leq 1$, the mole fraction z of Al in the p-type $Al_zGa_{1-z}N$ cladding layer 5 is $0 \leq z \leq 1$, and the mole fraction y of In in $Ga_{1-y}In_yN$ forming the active layer 4 is $0 \leq y \leq 1$. Si, for example, is doped into the n-type GaN contact layer 2 and the n-type $Al_xGa_{1-x}N$ cladding layer 3 as their n-type impurity. The p-type $Al_zGa_{1-z}N$ cladding layer 5 and the p-type GaN contact layer 6 are doped with Mg, for example, as their p-type impurity. The layers have the same thicknesses as those shown in the first embodiment.

An upper-lying part of the n-type GaN contact layer, n-type $Al_xGa_{1-x}N$ cladding layer 3, active layer 4, p-type $Al_zGa_{1-z}N$ cladding layer 5 and p-type GaN contact layer 6 are shaped into a stripe extending in the <0001>direction. An insulation film 7 made of $SiO_2$, for example, is formed on the p-type GaN contact layer 6. The insulation film 7 has formed a stripe-shaped aperture 7a extending in the <0001>direction. The aperture 7a is 5 $\mu$m wide, for example. The p-side electrode 8 is brought into contact with the p-type contact layer 6 through the aperture 7a. The n-side electrode 9 is in contact with the bottom surface of the n-type GaN substrate 1. The p-side electrode 8 may be a Ni/Au film, for example, and the n-side electrode 9 may be a Ti/Al/Au film, for example.

In the third embodiment, a pair of cavity edges are {0001}-oriented surfaces (C-faces), and opposite side surfaces of the cavity are {11-20}-oriented surfaces (A-faces).

Next explained is a method for manufacturing the GaN semiconductor laser having the construction according to the third embodiment.

First of all, the n-type GaN substrate 1 having the {01-10}-oriented surface (M-face) as its major surface is prepared, and stacked thereon, sequentially, are the n-type GaN contact layer 2, n-type $Al_xGa_{1-x}N$ cladding layer 3, active layer made of $Ga_{1-y}In_yN$, p-type $Al_zGa_{1-z}N$ cladding layer 5, and p-type GaN contact layer 6 by epitaxial growth using MOCVD. These nitride III-V compound semiconductor layers epitaxially grow in the {01-10} surface orientation. The same growth temperature as used in the first embodiment is used here again.

Next formed on the entire surface is the insulation film 7 by CVD or sputtering, for example. Then, a stripe-shaped resist pattern (not shown) extending in the <0001>direction is formed on the insulation film by lithography. Using the resist pattern as a mask, the insulation film 7 is selectively removed by etching. As a result, the aperture 7a is formed in the insulation film 7.

After the resist pattern used as the etching mask is removed, a Ni/Au film, for example, is formed on the entire surface by vacuum evaporation or sputtering, for example, and it is patterned by etching to make the p-side electrode 8. Stacked on the bottom surface of the n-type GaN substrate 1 is a Ti/Al/Au film, for example, by vapor deposition or sputtering, to form the n-side electrode 9.

After that, as shown in FIG. 2, by cleaving the GaN substrate 1 into bars along its high-cleavable {0001}-oriented faces, the n-type GaN contact layer 2, n-type $Al_xGa_{1-x}N$ cladding layer 3, active layer 4, p-type $Al_zGa_{1-z}N$ cladding layer 5 and p-type GaN contact layer 6 epitaxially grown on the GaN substrate 1 are cleaved together along their {0001}-oriented faces. As a result, cavity edges which are {0001}-oriented can be obtained. The cleavage may be done in the same manner as that of the first embodiment.

The bar-shaped GaN substrates 1 and the nitride III-V compound semiconductor layers thereon which are obtained by cleavage are divided into chips to obtain laser chips. For chipping the bar-shaped semi-products, the process as used for the first embodiment can be used.

According to the third embodiment, the same advantages as those of the first embodiment are obtained. Additionally, since the n-type GaN substrate 10 is conductive, the n-side electrode can be made on the bottom surface of the substrate as those of AlGaAs semiconductor lasers or AlGaInP semiconductor lasers. As a result, the process of manufacturing the GaN semiconductor laser is simplified as compared with the structure forming both the p-side electrode and the n-side electrode on top-side surfaces of the substrate, and the same manufacturing apparatus as used for manufacturing the AlGaAs semiconductor lasers using GaAs substrates can be used. These factors contribute to reducing the manufacturing cost of GaN semiconductor lasers.

Next explained is a GaN semiconductor laser according to the fourth embodiment of the invention.

In the GaN semiconductor laser according to the fourth embodiment, the n-type GaN substrate 10 has a {11-20}-oriented surface (A-face) as its major surface. Stacked thereon are the n-type GaN contact layer 2, n-type $Al_xGa_{1-x}N$ cladding layer 3, active layer 4, p-type $Al_zGa_{1-z}N$ cladding layer 5 and p-type GaN contact layer 6 in sequence. These nitride III-V semiconductor layers have {11-20} surface orientation. In this case, the opposite side surfaces of the cavity have {01-10}-oriented surfaces (M-faces). The other aspects of the GaN semiconductor laser shown here are the same as those of the GaN semiconductor laser according to the third embodiment, and their explanation is omitted here.

To fabricate the GaN semiconductor laser according to the fourth embodiment, the same method as used for fabricating the GaN semiconductor laser according to the third embodiment is used. Therefore, explanation of the manufacturing process is omitted here.

According to the fourth embodiment, the same advantages as those of the third embodiment are obtained.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first, second, third and fourth embodiments use MOCVD for epitaxial growth of the nitride III-V compound semiconductor layers, HVPE or molecular beam epitaxy (MBE) may be used for epitaxially growing these nitride III-V compound semiconductor layers. In the first and second embodiments, RIE is used to pattern the nitride III-V compound semiconductor layers into the form of stripe; however, the patterning may be done by chemical wet etching.

The GaN substrate used in the first, second, third and fourth embodiments may be replaced with a semiconductor substrate made of any other appropriate III-V compound semiconductor having a wurtzite-structured crystal structure, where appropriate.

The first, second and third embodiments have been explained as applying the invention to double heterostructure GaN semiconductor lasers; however, the invention is applicable also to a GaN semiconductor laser SCH (separate confinement heterostructure) structure in which an optical guide layer is interposed between the active layer and the cladding layer, or to those having a multiquantum well (MQW) structure or a single quantum well (SQW) structure as the active layer. As to the laser structure, various structures can be employed, such as ridge-guided structures realizing gain-guided or index-guided lasers, internal blocking structures, structural substrate lasers, longitudinal mode control structures (diffusion feedback (DFB) lasers, distributed Bragg reflector (DBR) lasers), and so on.

As described above, as to the semiconductor substrate according to the invention, it is made of a nitride III-V compound semiconductor having a wurtzite-structured crystal structure and has a major surface substantially normal to its {0001}-oriented face. Therefore, when nitride III-V compound semiconductor layers are grown on the semiconductor substrate to form a laser structure, the semiconductor substrate can be readily cleaved together with the overlying nitride III-V compound semiconductor layers along their high-cleavable {0001}-oriented faces. Cleaved surfaces, thus obtained, are smooth and optically excellent surfaces suitable for use as cavity edges of semiconductor lasers. Therefore, the semiconductor substrate is suitable for use in fabrication of semiconductor lasers using nitride III-V compound semiconductors.

As to the semiconductor device according to the invention, by using a semiconductor substrate made of a nitride III-V compound semiconductor having a wurtzite-structured crystal structure and having a major surface substantially normal to its {0001}-oriented face and by stacking thereon nitride III-V compound semiconductor layers, smooth and and optically excellent cleaved surfaces can be made only by cleaving the semiconductor substrate together with the overlying nitride III-V compound semiconductor layers along their high-cleavable faces. Therefore, by using the good-quality cleaved surfaces as cavity edges, semiconductor lasers having excellent characteristics, high efficiency, long lifetime and high reliability can be readily realized.

What is claimed is:

1. A semiconductor substrate made of a nitride III-V compound semiconductor having a wurtzite-structured crystal structure and having a {01-10}-oriented M-face major surface, said substrate having a {0001}-oriented C-face, and a {11-20}-oriented A-face.

2. A semiconductor substrate made of a nitride III-V compound semiconductor having a wurtzite-structured crystal structure and having a major surface offset from a {01-10}-oriented M-face of the substrate, said substrate having a {0001}-oriented C-face, and a {11-20}-oriented A-face, wherein the major surface is within ±5° of normal to the {0001}-oriented C-face of the substrate.

3. A semiconductor substrate made of a nitride III-V compound semiconductor having a wurtzite-structured crystal structure and having a {11-20}-oriented A-face major surface, said substrate having a {0001}-oriented C-face, and a {01-10}-oriented M-face.

4. A semiconductor substrate made of a nitride III-V compound semiconductor having a wurtzite-structured crystal structure and having a major surface offset from a {11-20}-oriented A-face of the substrate, said substrate having a {0001}-oriented C-face, and a {01-10}-oriented M-face, wherein the major surface is within ±5° of normal to the {0001}-oriented C-face of the substrate.

5. A semiconductor device comprising:
  a semiconductor substrate made of a nitride III-V compound semiconductor having a wurtzite-structured crystal structure and having a {01-10}-oriented M-face major surface, said substrate having a {0001}-oriented C-face, and a {11-20}-oriented A-face; and nitride III-V compound semiconductor layers on said semiconductor substrate.

6. A semiconductor device comprising:

a semiconductor substrate made of a nitride III-V compound semiconductor having a wurtzite-structured crystal structure and having a major surface offset from a {01-10}-oriented M-face of the substrate, said substrate having a {0001}-oriented C-face, and a {11-20}-oriented A-face, wherein the major surface is within ±5° of normal to the {0001}-oriented C-face of the substrate; and nitride III-V compound semiconductor layers on said semiconductor substrate.

7. A semiconductor device comprising:

a semiconductor substrate made of a nitride III-V compound semiconductor having a wurtzite-structured crystal structure and having a {11-20}-oriented A-face major surface, said substrate having a {0001}-oriented C-face, and a {01-10}-oriented M-face; and nitride III-V compound semiconductor layers on said semiconductor substrate.

8. A semiconductor device comprising:

a semiconductor substrate made of a nitride III-V compound semiconductor having a wurtzite-structured crystal structure and having a major surface offset from a {11-20}-oriented A-face of the substrate, said substrate having a {0001}-oriented C-face, and a {01-10}-oriented M-face, wherein the major surface is within ±5° of normal to the {0001}-oriented C-face of the substrate; and nitride III-V compound semiconductor layers on said semiconductor substrate.

* * * * *